(12) United States Patent
Fanfair et al.

(10) Patent No.: US 8,110,510 B1
(45) Date of Patent: Feb. 7, 2012

(54) LOW TEMPERATURE SYNTHESIS OF NANOWIRES IN SOLUTION

(75) Inventors: Dayne D. Fanfair, Austin, TX (US); Brian A. Korgel, Round Rock, TX (US)

(73) Assignee: Merck Patent GmbH, Darmstadt (DE)

( * ) Notice: Subject to any disclaimer, the term of this patent is extended or adjusted under 35 U.S.C. 154(b) by 882 days.

(21) Appl. No.: 11/582,132

(22) Filed: Oct. 17, 2006

Related U.S. Application Data

(60) Provisional application No. 60/727,587, filed on Oct. 17, 2005.

(51) Int. Cl.
*H01L 21/00* (2006.01)
(52) U.S. Cl. .......... 438/800; 977/811; 977/825
(58) Field of Classification Search .......... 977/813–827, 977/811; 438/800; 257/E51.04
See application file for complete search history.

(56) References Cited

U.S. PATENT DOCUMENTS

| | | | |
|---|---|---|---|
| 6,788,453 B2 | 9/2004 | Banin et al. | |
| 2003/0214699 A1* | 11/2003 | Banin et al. | 359/333 |
| 2003/0224162 A1* | 12/2003 | Hirai et al. | 428/402 |
| 2005/0266662 A1* | 12/2005 | Yi | 438/479 |
| 2006/0019472 A1* | 1/2006 | Pan et al. | 438/486 |
| 2006/0258132 A1* | 11/2006 | Brown et al. | 438/610 |
| 2007/0134491 A1* | 6/2007 | Atsuki et al. | 428/402 |
| 2007/0178709 A1* | 8/2007 | Kamins | 438/777 |
| 2008/0023677 A1* | 1/2008 | Frechet et al. | 252/517 |

OTHER PUBLICATIONS

Hanrath, T. & Korgel, B. A. (2002). Nucleation and growth of germanium nanowires seeded by organic monolayer-coated gold nanocrystals. J. Am. Chem. Soc. 124(7), 1424-1429.*
Heath, James R., et al., "A liquid solution synthesis of single chrystal germanium quantum wires," Chemical Physics Letters, vol. 208, No. 3, 4, 263-268, Jun. 11, 1993.

(Continued)

*Primary Examiner* — Charles Garber
*Assistant Examiner* — Calvin Choi
(74) *Attorney, Agent, or Firm* — John A. Fortkort; Fortkort & Houston P.C.

(57) ABSTRACT

Methods synthesizing nanowires in solution at low temperatures (e.g., about 400° C. or lower) are provided. In the present methods, the nanowires are synthesized by exposing nanowire precursors to metal nanocrystals in a nanowire growth solution comprising a solvent. The metal nanocrystals serve as seed particles that catalyze the growth of the semiconductor nanowires. The metal nanocrystals may be formed in situ in the growth solution from metal nanocrystal precursors. Alternatively, the nanowires may be pre-formed and added to the growth solution.

43 Claims, 5 Drawing Sheets

OTHER PUBLICATIONS

Trentler, Timothy J., "Solution-Liquid-Solid Growth of Crystalline III-V Semiconductors: An Analogy to Vapor-Liquid-Growth," Science, vol. 270, No. 5243, 1791-1794, Dec. 15, 1995.

Yu, Heng, et al., "Solution-Liquid-Solid Growth of Soluble GaAs Nanowires," Advanced Materials, vol. 15, No. 5, 416-419, Mar. 4, 2003.

Yu, Heng, et al., "Cadmium Selenide Quantum Wires and the Transition from 3D to 2D Confinement," J. Am. Chem. Soc., vol. 125, 16168-16169, Aug. 16, 2003.

Aug. 16, 2003, Yu, Heng, et al., "Supplementary Information for: Cadmium Selenide Quantum Wires and the Transition from 3D to 2D Confinement," Department of Chemistry and Physics, Washington University, St. Louis, MO 63130-4899 and Computational Research Division, Lawrence Berkeley National Laboratory, Berkeley, CA 94720.

Nedeljkovic, Jovan M., et al., "Growth of InP Nanostruetures via Reaction of Indium Droplets with Phosphide Ions: Synthesis of InP Quantum Rods and InP-$TiO_2$ Composites," J. Am. Chem. Soc., vol. 126, 2632-2639, Feb. 4, 2004.

Grebinski, James W., et al., "Solution-Based Straight and Branched CdSe Nanowires," Chem. Mater., vol. 16, 5260-5272, Nov. 17, 2004.

Lu, Xianmao, "High Yield Solution-Liquid-Solid Synthesis of Germanium Nanowires," J. Am. Chem. Soc., vol. 127, 15718-15719, Aug. 25, 2005.

Wang, Fudong, et al., Solution-Liquid-Solid Growth of Semiconductor Nanowires, Inorganic Chemistry, vol. 45, No. 19, 7511-7521, Mar. 24, 2006.

\* cited by examiner

LOW TEMPERATURE SYNTHESIS OF NANOWIRES IN SOLUTION

CROSS REFERENCE TO RELATED APPLICATION

This non-provisional application claims priority based upon U.S. Provisional Patent Application No. 60/727,587, filed Oct. 17, 2005, the entire disclosure of which is hereby incorporated by reference in its entirety and for all purposes.

FIELD OF THE INVENTION

This invention generally relates to methods for producing nanowires in organic solvents at low temperatures.

BACKGROUND

Research in semiconductor nanowires has been fueled by their unique optical, electronic, and mechanical properties and their potential use in optoelectronic devices, chemical and biological sensors, computing devices, and photovoltaics (Law, M.; Goldberger, J.; Yang, P. D. *Ann. Rev. Mater. Res.* 2004, 34, 83). Semiconductor nanowires have been synthesized under a wide range of conditions, from high temperature (<1100° C.) gas-phase reactions to relatively low temperature (>250° C.) solution-phase conditions (Law, M.; Goldberger, J.; Yang, P. D. *Ann. Rev. Mater. Res.* 2004, 34, 83; Hu, J. T.; Odom, T. W.; Lieber, C. M. Accts. Chem. Res. 1999, 32, 435; Trentler, T. J.; Hickman, K. M.; Goel, S. C.; Viano, A. M.; Gibbons, P. C.; Buhro, W. E. *Science* 1995, 270, 1791; Yu, H.; Li, J. B.; Loomis, R. A.; Gibbons, P. C.; Wang, L. W.; Buhro, W. E. *J. Am. Chem. Soc.* 2003, 125, 16168; Fanfair, D. D.; Korgel, B. A. *Crystal Growth & Design* 2005, 5, 1971). Solution-phase routes to semiconductor nanowires are particularly interesting due to their potential for good size and shape control, chemical surface passivation, colloidal dispersibility, and high throughput continuous processes.

Nanocrystals and nanowires of Group IV materials, such as C, Si and Ge, have been extremely challenging to synthesize in solution due to their high crystallization energy barrier, and the propensity of those elements to form stable oligomeric species with hydrocarbons. In the past, crystalline Si and Ge nanowires and multiwall carbon nanotubes have been fabricated using supercritical solvents that are heated well above their boiling points to temperatures between 350° C. and 650° C. by pressurization (Holmes, J. D.; Johnston, K. P.; Doty, R. C.; Korgel, B. A. Science 2000, 287, 1471; Hanrath, T.; Korgel, B. A. *J. Am. Chem. Soc.* 2002, 124, 1424; Lee, D. C.; Mikulec, F. V.; Korgel, B. A. J. Am. Chem. Soc. 2004, 126, 4951). These temperatures exceed the decomposition temperatures of organosilane and organogermane precursors and the Au:Si and Au:Ge eutectic temperatures (~360° C.), making it possible to promote Au nanocrystal-seeded nanowire growth (Shah, P. S.; Hanrath, T.; Johnston, K. P.; Korgel, B. A. *J. Phys. Chem. B* 2004, 108, 9574). Although very high quality nanowires are obtained, it would be more desirable to synthesize crystalline nanowires under milder conditions to alleviate solvent decomposition and safety concerns.

SUMMARY

Methods for synthesizing nanowires in solution at low temperatures (e.g., about 400° C. or lower) are provided. In the present methods, the nanowires are synthesized by exposing nanowire precursors to metal nanocrystals in a nanowire growth solution comprising an organic solvent. The metal nanocrystals serve as seed particles that catalyze the growth of the semiconductor nanowires. The metal nanocrystals may be formed in situ in the growth solution from metal nanocrystal precursors. Alternatively, the nanocrystals may be preformed and added to the growth solution.

A broad range of semiconductor nanowires may be produced using the present methods. Non-limiting examples of such nanowires include nanowires composed of Group IV semiconductors, alloys of Group IV semiconductors, Group III-V semiconductors, and alloys of Group III-V semiconductors with other Group III and/or Group V elements, and Group II-VI semiconductors, and alloys of Group II-VI semiconductors with other Group II and/or Group VI elements. The nanowires may also be doped with magnetic impurities to form dilute magnetic semiconductors. Furthermore, the nanowires may have a core/shell configuration and/or may have a compositional modulation along their length.

Metal nanocrystals that may be used to seed nanowire growth include bismuth, tin, sodium, indium, lead and aluminum, with bismuth and tin being particularly preferred. The metal nanocrystals may be core/shell nanocrystals, such as gold, surrounded by bismuth, or gold, surrounded by lead. The metal nanocrystals may also be alloys, such as Au/Bi or Au/Pb.

For purposes of illustration only, a specific example of the types of nanowires that may be produced according to the present methods are germanium nanowires grown from bismuth seed nanocrystals using, for example, a germanium halide nanowire precursor. Another illustrative example is GaP nanowires grown from bismuth seed crystals using, for example, organophosphate and organogallium precursors.

Further objects, features and advantages of the invention will be apparent from the following detailed description when taken in conjunction with the accompanying drawings.

DETAILED DESCRIPTION

Figure 1:
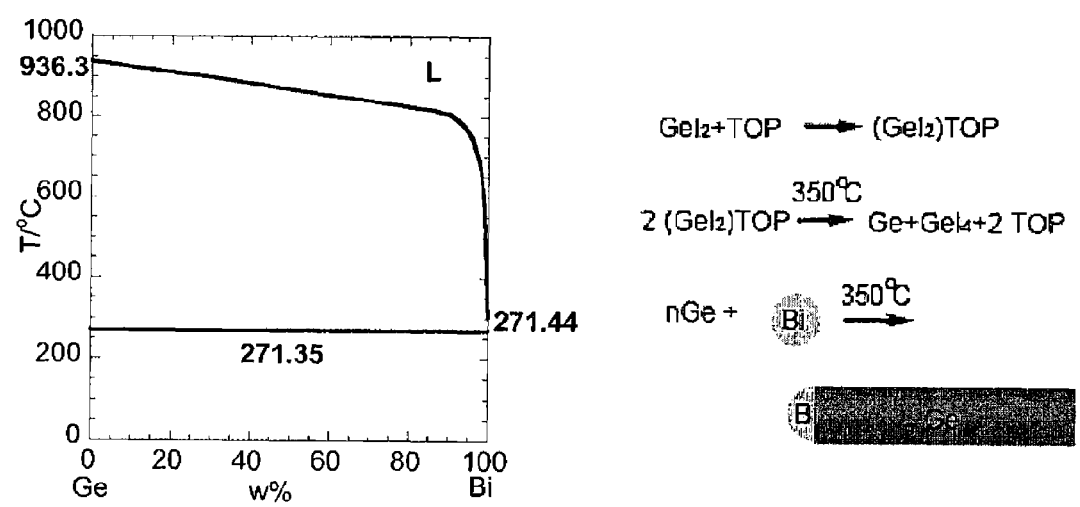
FIG. 1 shows the binary phase diagram of Ge—Bi and Ge nanowire growth mechanism.

The present invention provides methods for the low temperature synthesis of semiconductor nanowires in organic solvents.

The semiconductor nanowires are synthesized by exposing nanowire precursors to metal nanocrystals in a nanowire growth solution comprising an organic solvent using a solution-liquid-solid (SLS) growth process. In some cases, the solvent may be an ionic liquid. The metal nanocrystals serve as seed particles that catalyze the growth of the semiconductor nanowires. The metal nanocrystals may be formed in situ in the growth solution from metal nanocrystal precursors. Thus, in some embodiments, nanowire precursors and nanocrystal precursors are charged (e.g., injected), preferably simultaneously, into the growth solution which is held at an elevated temperature. However, in other embodiments, the nanocrystals may be added to the growth solution. The nanowires may be grown as free nanowires in the growth solution, or may be grown from a substrate surface. For example, the nanowires may be grown from nanocrystals that are tethered, or otherwise attached, to a substrate. Once the nanowire growth is sufficiently complete, the growth process may be stopped (e.g., by cooling the reaction mixture and/or diluting the solution with a hydrocarbon solvent) and the nanowires may be separated by one or more separation steps. An additional capping ligand may be added to the nanowire growth solution to coat the nanowires with an electrical and chemical passivation layer.

The methods are desirably carried out at an elevated temperature that is below the boiling point of the organic solvent. Because higher reaction temperatures generally lead to better nanowire crystallinity, high boiling point organic solvents are preferred. In some embodiments nanowire growth is carried out at a temperature of up to about 450° C. This includes embodiments where nanowire growth is carried out at a temperature of up to about 420° C., up to about 400° C., up to about 370° C., up to about 370° C., and up to about 350° C. For example, nanowire growth may be carried out at a temperature between about 200° C. and 350° C. This includes embodiments where nanowire growth is carried out at a temperature between about 300° C. and 340° C. The reactions may be carried out at ambient or elevated pressures. Where elevated pressures are used, however, the elevated pressures are not used to create supercritical conditions. Thus, the present methods are clearly distinguishable from known methods of producing semiconductor nanoparticles under supercritical conditions.

The nanowires produced in accordance with the present methods are characterized in that their length dimensions are significantly larger than their height or width dimensions. Typically the nanowires would have lengths of at least about 10 nm and height and width of no more than about 5 nm. In some instances the nanowires will have a length of at least about 100, 200 or even 500 nm. Longer nanowires may have correspondingly broader height and width dimensions. For example, in some instances, the nanowires may have heights and/or widths (i.e., diameters) of up to about 50 nm. In general, the nanowires will have aspect ratios of at least about 5. However, the nanowires produced in accordance with the present invention are not limited to those having such dimensions. In some cases the metal nanocrystal will remain at one end of the nanowires after nanowire synthesis.

Examples of semiconductor nanowires that may be synthesized by the present methods include, but are not limited to, Group IV semiconductor nanowires, Group III-V semiconductor nanowires, and Group II-VI semiconductor nanowires. Group IV nanowires include silicon (Si), germanium (Ge) and tin (Sn) nanowires. Group III-V nanowires include InAs, GaAs, GaP, GaSb, InP, InSb, GaN, InN, AlAs, AlP, and AlSb semiconductor nanowires. Group II-VI nanowires include cadmium-containing nanowires, such as CdS, CdSe, CdTe, and zinc-containing nanowires, such as ZnS, ZnSe and ZnTe.

The nanowires may also comprise alloys of Group IV elements or alloys of Group III-V semiconductors with other Group III or Group V elements (e.g., InGaAs or GaAsP nanowires). The use of alloy nanowires is advantageous because the alloy composition of the nanowires can be tailored to optimize the bandgaps for the nanowires depending upon their intended application. In some embodiments the alloy nanowires may have a composition that is modulated along their lengths. For example, the Group IV alloy nanowires may be produced with alternating bands of different Group IV elements (e.g., Ge/Si/Ge . . . ). Alternatively, the nanowires may be produced with a compositional gradient along their lengths. The compositional modulation may be accomplished by adding the appropriate precursor molecules at different times and/or at different concentrations during nanowire growth. The nanowires may also be core/shell type nanowires wherein the core nanowire has a different composition than the shell surrounding it. For example Group IV core/shell nanowires may have a core nanowire and a nanowire shell that comprises Group IV elements independently selected from the group consisting of C, Si, Ge and Sn.

Dopants may be introduced into the nanowires by introducing dopant precursors to the growth solution during nanowire growth. Suitable dopants include, but are not limited to, boron (B), phosphorus (P), arsenic (As), selenium (Se), rare earth metals, and lanthanides, such as europium (Eu) and samarium (Sm). Suitable dopant precursors include organometallics and salts or salt complexes thereof.

The nanowire precursors used to synthesize the semiconductor nanowires may be any precursor molecules that decompose in the growth solution to form semiconductor nanowires in the presence of the metal nanocrystals. The selection of appropriate nanowire precursors will depend, at least in part, on the desired composition of the nanowires, the nature of organic solvent and the reaction temperature.

In some embodiments of the present methods, the nanowire precursors are inorganic precursor molecules. The use of inorganic precursor molecules may be advantageous because they produce semiconductor nanowires with minimal organic contamination. In some cases, an additional reducing agent, catalyst, or free radical initiator may be added to the nanowire growth solution to promote precursor decomposition. However, organic nanowire precursors, such as organometallic precursor molecules may also be used.

Suitable inorganic precursors for Group IV semiconductor nanowires include, but are not limited to, Group IV metal halides. Specific examples of Group IV metal halides include, but are not limited to, $GeI_2$, $GeI_4$, $GeCl_4$, $GeBr_4$, $SiI_4$, $SiCl_4$, $SiBr_4$, $SnI_4$, $SnCl_4$, and $SnBr_4$.

Suitable organic precursors for Group IV semiconductor nanowires include organometallics. Organometallic precursor molecules include a Group IV metal and organic groups. Organometallic Group IV precursors include, but are not limited to organosilicon, organogermanium and organotin compounds. Some examples of Group IV precursors include, but are not limited to, alkylgermaniums, alkylsilanes, alkylstannanes, chlorosilanes, chlorogermaniums, chlorostannanes, aromatic silanes, aromatic germaniums and aromatic stannanes. Other examples of silicon precursors include, but are not limited to, disilane ($Si_2H_6$), trisilane ($Si_3H_8$), silicon tetrachloride ($SiCl_4$), trichlorosilane ($HSiCl_3$) and dichlorosilane ($H_2SiCl_2$). Still other suitable precursor molecules for use in forming crystalline silicon nanowires include alkyl and aromatic silanes, such as dimethylsilane ($H_3C$—$SiH_2$—

$CH_3$), tetraethyl silane (($CH_3CH_2)_4Si$) and diphenylsilane (Ph-$SiH_2$-Ph). In addition to germane, particular examples of germanium precursor molecules that may be used to form Ge nanowires include, but are not limited to, tetraethyl germane (($CH_3CH_2)_4Ge$) and diphenylgermane (Ph-$GeH_2$-Ph).

To synthesize Group III-V nanowires at least one Group III element precursor and at least one Group V element precursor should be included in the growth solution. Examples of Group III and Group V precursors that may be used include, but are not limited to, tris(trimethylsilyl)arsine (($SiMe_3)_3As$), indium chloride ($InCl_3$), gallium (III) acetylacetonate (Ga$(acac)_3$), gallium chloride ($GaCl_3$), tris(trimethylsilyl)phosphine (($SiMe_3)_3P$), ($^tBu)_3Ga$, and $As(SiMe_3)_3$. In some cases, the precursors may be single-source precursors containing a Group III element and a Group V element.

To synthesize Group II-VI nanowires at least one Group II element precursor and at least one Group VI element precursor should be included in the growth solution. Alternatively, a single-source precursor that includes a Group II element and a Group VI element may be used. Examples of Group II and Group VI precursors that may be used include, but are not limited to, cadmium oxide (CdO), zinc oxide (ZnO), diethylzinc ($Et_2Zn$), zinc acetate (($C_4H_6O_4)Zn$), and solutions of trioctylphosphine-sulfide (TOP—S), trioctylphosphine-selenide (TOP—Se), and trioctylphosphine-telluride (TOP—Te).

In order to promote nanowire growth, various additives may be included in the growth solution. Such additives include reducing agents and free radical promoters. Superhydride, LiH and LiAlH are two examples of reducing agents that are well-suited for use with Group IV metal halide nanowire precursors. Diisobutylaluminum hydride may also be used.

In the present methods, metal nanocrystals provide seed particles for the nucleation and growth of the nanowires. Suitable metal nanocrystals include, but are not limited to, bismuth (Bi), tin (Sn), indium (In), lead (Pb) and aluminum (Al) nanocrystals. The nanocrystals may be made from a single metal, or may be composed of metal alloys. For example, any of the prior-mentioned metal nanocrystals could be alloyed with one or more of the following metals: gold (Au), silver (Ag), copper (Cu), nickel (Ni), cobalt (Co), iridium (Ir), manganese (Mn) and iron (Fe), to provide a metal alloy seed nanocrystal. Specific examples of alloy nanocrystals that may be employed as seed particles include Au/In, Au/Sn, Ag/Bi, Au/Pb, Ag/Ga, Ag/Sn and Ag/In nanocrystals.

The metal nanocrystals desirably have diameters that are no more than about 100 nm, more desirably, no more than about 50 nm, and still more desirably no more than about 10 nm. This includes nanocrystals having diameters of between about 1 and 50 nm, further includes nanocrystals having diameters of between about 1 and 10 nm and still further include nanocrystals having diameters of no more than about 5 nm. The nanocrystals may have a relative monodisperse or a polydisperse size distribution. For example, the size distribution of the nanocrystals may be relatively monodisperse with a standard deviation about the mean diameter of less than about 10%. Alternatively, the size distribution of the nanocrystals may be polydisperse with a standard deviation about the mean diameter greater than 10%, greater than 20%, or even greater than 25%.

The metal nanocrystals may be pre-formed and added to the growth solution. However, the nanocrystals are may also be formed in situ in the growth solution. This may be accomplished by charging metal nanocrystal precursors into the growth solution under conditions that promote the decomposition of the nanocrystal precursors and the nucleation of nanocrystal seed particles. Typically, the nanocrystal precursors are added to the growth solution along with one or more nanowire precursors. An example of a precursor that may be used to form Bi nanocrystals is Bi (III) 2-ethylhexanoate, which is desirably added to the growth solution along with a reducing agent, such as $NaBH_4$. Other metal nanocrystal precursors include metalorganics and metal carbonyls. Polyalcohols may be added in addition to these precursors to aid the formation of the seed metal particles in situ.

The solvents used in the nanowire growth solution are desirably carried out in organic solvents having high boiling points (e.g., at least about 200° C.). Examples of suitable organic solvents include, but are not limited to, phosphorus- or nitrogen-containing polar organic solvents, such as trioctylphosphine (TOP), trioctylphosphine oxide (TOPO), triphenylphosphine (TPP), triphenylphosphine oxide (TPPO), or an amine, such as trioctylamine (TOA). The use of these solvents is advantageous because they help to sterically stabilize the metal nanocrystals and/or provide nanocrystal size control as crystal growth terminators. Other suitable solvents include fluorinated solvents, ionic liquids (such as tetraoctylammonium bromide), ethers and coordinating solvents. Other non-limiting examples of suitable solvents include squalane and oleylamine. In addition to the solvent, the nanowire growth solution may include one or more capping ligands which coat the outer surfaces of the nanocrystals and/or nanowires. The capping ligands may act as a passivating layer and may help to tailor the nanocrystal/nanowire solubility characteristics. Examples of suitable capping ligands include, but are not limited to, thiols, phosphines, amines, alkenes, alkoxides and siloxanes.

The nanowires produced in accordance with the present methods are well-suited for use in a variety of applications including, but not limited to, electronic and optical devices such as optical sensors, optical detectors, photovoltaic cells, integrated circuit interconnects, field effect transistors, biochemical sensors, light-emitting diodes, and complementary logic devices.

EXAMPLES

Example 1

Synthesis of Germanium Nanowires Using Bismuth Seed Nanocrystals

Bi nanocrystal synthesis. Bi nanocrystals were prepared by arrested precipitation in dioctylether and TOP. 0.1 mL Bi(III) 2-ethylhexanoate (Bi[$OOCCH(C_2H_5)C_4H_9]_3$), and 0.15 mL TOP, was added to 11 mL dioctylether ($C_{16}H_{34}O$) and stirred for 15 min. Separately, the reducing agent (30 mg $NaBH_4$) was dissolved in 3.4 mL ethylenediamine by heating to 45° C. and stirring for 15 min. The reducing agent solution was cooled to room temperature and injected into the Bi precursor solution under vigorous stirring. The reaction mixture progressed from a milky appearance to a black color as the Bi precursor reduced to Bi metal nanocrystals. After 30 min, the crude nanocrystal dispersion was removed from the Schlenk line. The nanocrystals were precipitated with ~5 mL ethanol and centrifuged at 8,000 rpm for 5 min. The supernatant was discarded. The dried nanocrystals were stored under nitrogen until needed, as the Bi nanocrystals were found to be very sensitive to oxidation and air exposure.

Ge nanowire synthesis. Ge nanowires were synthesized under nitrogen in a three-neck flask on a Schlenk line. $GeI_2$ (Strem Chemicals, packed under argon) was stored in a nitrogen-filled glovebox upon purchase. Tri-n-octylphosphine (Tech. grade, Aldrich) was degassed through a freeze-pump-thaw technique and distilled at 200° C. and 0.3 Ton. All other solvents were used as received from Fisher Scientific without further purification. A precursor solution of 0.3 M GeI$_2$ in TOP was prepared by adding 0.2 g GeI$_2$ into 2 ml TOP in the glovebox. A clear yellow solution was formed after stirring for 1 hr. Bi nanocrystals were prepared following the procedures of Fanfair and Korgel, described above (Fanfair, D. D.; Korgel, B. A. *Crystal Growth & Design* 2005, 5, 1971). 0.6 mg Bi nanoparticles were mixed with 0.5 ml TOP and sonicated for 2 hrs to form a grey dispersion. 0.5 ml Bi nanoparticle dispersion and desired volume of GeI$_2$ solution in TOP (0.8 ml for GeI$_2$ to Bi mole ratio of 80:1, 0.5 ml for a ratio of 50:1) were loaded into a 3 ml plastic syringe. 4 ml TOP was loaded into a 3-neck flask and heated to 365° C. under N$_2$, followed by the injection of the GeI$_2$ and Bi nanocrystal solution through a rubber septum with stirring. The introduction of the precursor and Bi nanocrystals immediately produced a gray solution. The temperature dropped to 350° C. and the reaction was allowed to proceed at 350° C. for 10 min before taking the reaction flask off the heating mantle and allowing it to cool to room temperature. The nanowire dispersion was diluted with 10 mL toluene and centrifuged at 8,000 rpm for 5 min. The nanowires in the black precipitate were redispersed in 2.5 ml CHCl$_3$ and precipitated with 2.5 ml ethanol and centrifuged again to obtain a purified nanowire product. Nanowires were dried on a rotary evaporator and stored under nitrogen prior to characterization.

Materials Characterization. The nanowires were characterized by scanning electron microscopy (SEM), transmission electron microscopy (TEM), energy-dispersive X-ray spectroscopy (EDS) and powder X-ray diffraction (XRD). SEM samples were prepared by drop casting chloroform-dispersed nanowires onto Si substrates. SEM was performed on a LEO 1530 field emission gun SEM, operating at 10 kV accelerating voltage, and digital SEM images were acquired using an Inlens detector and LEO 32 software system. TEM specimens were prepared by drop casting dilute dispersions of nanowires after washing with 5% HCl acid for 5 min onto 200-mesh copper grids coated with lacy carbon film (Ladd Research Co.). High resolution TEM (HRTEM) was performed on a JEOL 2010F TEM; images were obtained digitally with a GATAN digital photography system. EDS was performed on the JEOL 2010F HRTEM equipped with an Oxford spectrometer. X-ray diffraction (XRD) was obtained from ~2 mg nanowires deposited by drop casting on quartz slides (Gem Dugout, State College, Pa.) with continuous scan for 3 hours at a rate of 12°/min and 0.02° per step using a Bruker-Nonius D8 Advance powder diffractometer with Cu K$_\alpha$ radiation ($\lambda$=1.54 Å) and a rotary sample stage (30 rpm).

The low melting metal Bi, forms a eutectic with Ge at 271.4° C., which is well within the temperature window for conventional solvents. Based on the Bi:Ge phase diagram, Bi is a good candidate for Ge nanowire synthesis. Ge nanowire synthesis in a conventional solvent is also favored by a precursor that is sufficiently reactive at ~350° C. One aspect of the present invention is based, at least in part, on the inventors' identification of GeI$_2$ as an effective precursor for Ge nanocrystal synthesis with high yields and minimal organic contamination. The synthesis of Ge nanocrystals using GeI$_2$ as a precursor is desirably carried out at 300° C. in TOP.

FIG. 1 outlines the germanium nanowire growth mechanism using GeI$_2$ as a precursor and TOP as an organic solvent. Two key aspects of the chemistry enable the production of crystalline Ge nanowires in TOP: (1) the low temperature Bi:Ge eutectic at ~270° C. and (2) the highly reactive organic-free Ge precursor, GeI$_2$. GeI$_2$ disproportionates to Ge and GeI$_4$ with relatively high chemical yield at temperatures greater than ~330° C.—far below its boiling point at 550° C. and the boiling point of many widely used solvents, e.g. Tri-n-octylphosphine (TOP). GeI$_2$ also forms a very soluble complex of (GeI$_2$).R$_3$P, when mixed with TOP, which dissociates at 120° C., making it an ideal precursor for SLS Ge nanowire synthesis. (King, R. B., *Inorg. Chem.* 1963, 2, 199.)

Figure 2:
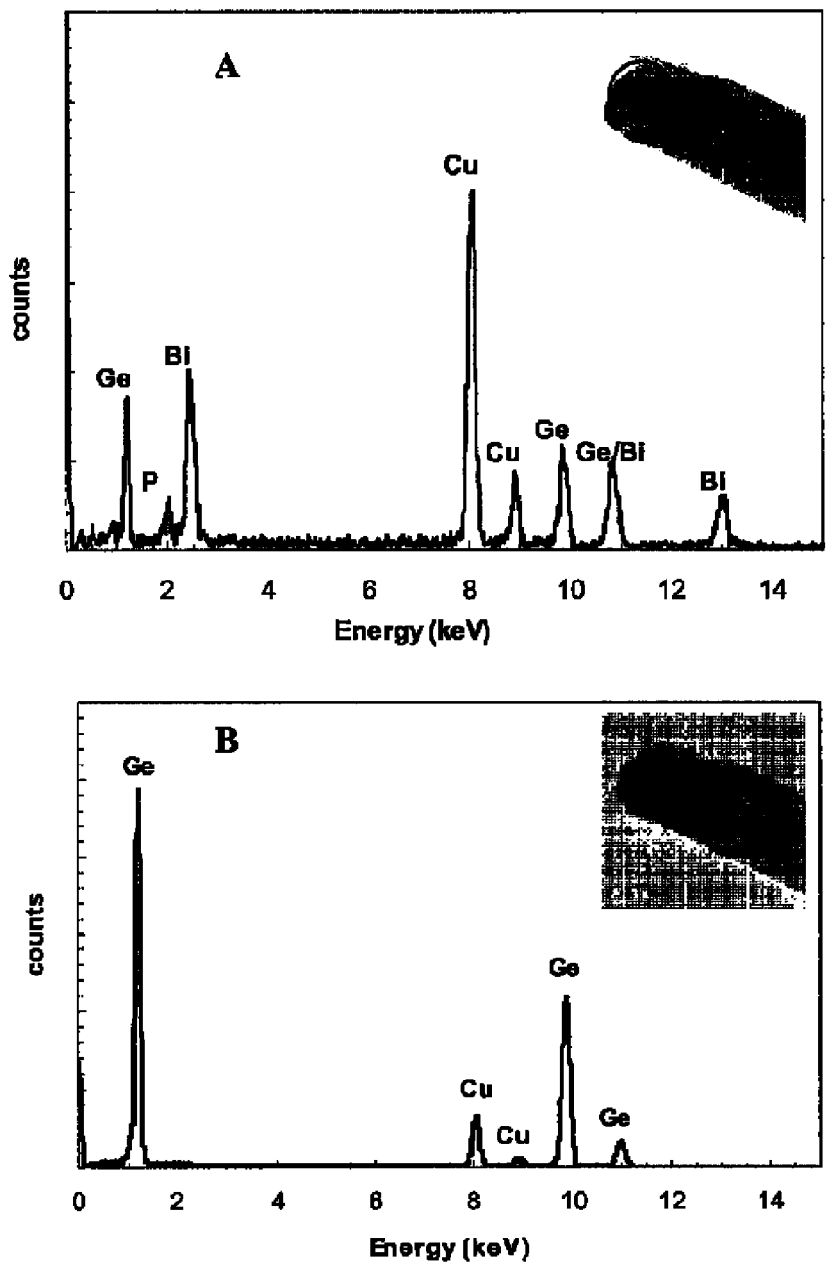
FIG. 2 shows the EDS of a Ge nanowire: the black circles drawn in the TEM images in the insets indicate the beam position. (A) EDS of the nanowire tip shows both Ge and Bi with a ratio of ~1:1 (Ge:Bi). The peaks of Cu and P are from the copper TEM grid and the solvent of TOP used in the reaction, respectively. (B) EDS taken from the nanowire core shows only Ge.

Ge nanowires were produced by injecting GeI$_2$ along with sterically-stabilized 20 nm diameter Bi nanocrystals into TOP at 365° C. on a Schlenk line, as described above. In this synthesis TOP served as a capping ligand that prevented significant nanocrystal aggregation but did not interfere with nanowire growth. The best Ge nanowire product was obtained using a GeI$_2$:Bi mole ratio of 80:1. Scanning electron microscopy (SEM) of the reaction product synthesized from GeI$_2$ and Bi nanoparticles in TOP at 350° C. showed a large amount of nanowires (FIG. 2). The wires were long and generally straight, ranging in diameter from 20 to 150 nm with an average of ~50 nm, with aspect ratios exceeding 100. The average length of the nanowires is greater than 5 μm and many are longer than 10 μm. The product was nearly free of contaminants and the Ge nanowire reaction yield was very high: 7.5 mg of pure Ge nanowires were obtained in a typical reaction with 0.6 mg Bi nanoparticles and 75 mg GeI$_2$ in 5 ml TOP, corresponding to a yield of ~40%. Bi particles could be observed at the ends of some Ge nanowires. Energy-dispersive X-ray spectroscopy (EDS) mapping of the observed confirmed that the particles are composed of Bi (FIG. 2). At a lower GeI$_2$:Bi ratio (GeI$_2$:Bi=50:1), both straight and tortuous wires were observed (FIG. 2D)—the tortuous wires generally have a similar average diameter but shorter length (<1 μm).

Figure 3:
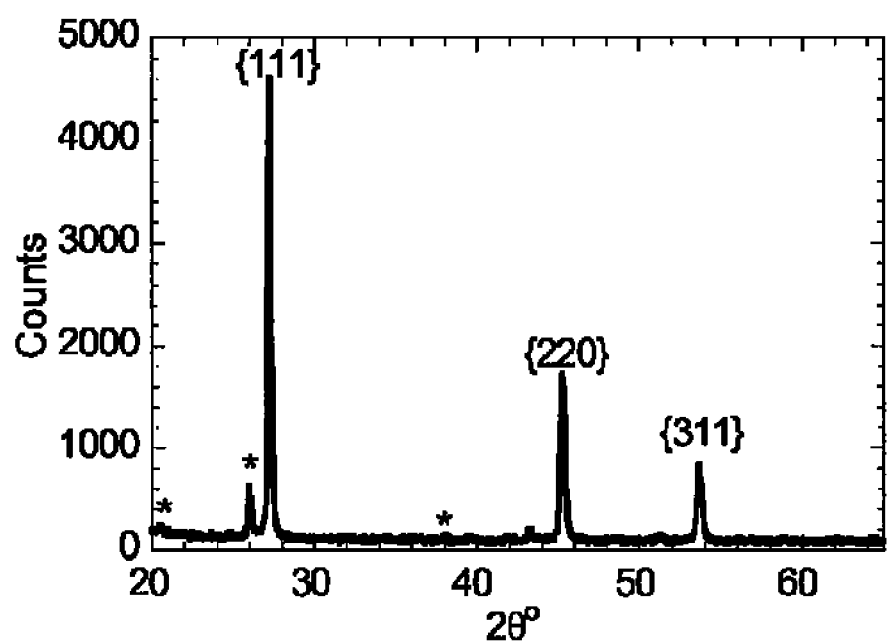
FIG. 3 shows the XRD of Ge nanowire showing a diamond cubic crystal structure of Ge with {111}, {220} and {311} peaks. The peaks labeled with * are from hexagonal $GeO_2$.

High resolution transmission electron microscopy (HR-TEM) (FIG. 4) and X-ray diffraction (XRD) (FIG. 3) both confirmed that the nanowires were crystalline diamond cubic Ge. Two nanowires imaged by TEM showed the nanowire growth direction was predominantly <111>. A small number of nanowires (~10% of the sample) exhibited <110> growth direction. A mixture of <111> and <110> growth direction is similar to what has been observed for Ge nanowires synthesized in supercritical solvents (Hanrath, T.; Korgel, B. A. *J. Am, Chem. Soc.* 2002, 124, 1424; Hanrath, T.; Korgel, B. A. *Small* 2005, 1, 717). The straight Ge nanowires are single crystals, nearly free of extended defects. The XRD pattern in FIG. 3 exhibits diffraction peaks corresponding to the {111}, {220}, {311} reflections of diamond cubic Ge. A small amount of GeO$_2$ can also be observed in the XRD pattern, which is consistent with TEM images that showed the nanowire surfaces to be oxidized.

Example 2

Synthesis of InAs, GaP, GaAs and InP Nanowires Using Bismuth Seed Nanocrystals

Chemicals. All manipulations were done using Schlenk line techniques under nitrogen. Tris(trimethylsilyl)arsine ((SiMe$_3$)$_3$As) was prepared according to literature methods (McAlpine, M. C.; Friedman, R. S.; Lieber, C. M. *Nano Lett.* 2003, 3, 443-445). Indium (III) chloride (InCl$_3$), gallium (III) acetylacetonate (Ga(acac)$_3$), gallium (III) chloride (GaCl$_3$), tris(trimethylsilyl)phosphine ((SiMe$_3$)$_3$P), and bismuth (III) 2-ethylhexanoate were used as received from STREM. Ethylenediamine, dioctylether, sodium borohydride (NaBH$_4$), tri-n-octylphosphine (TOP), myristic acid, butanol, trioctylamine (TOA), and trioctylphosphine oxide (TOPO) were used as received from Sigma-Aldrich. All other solvents were used as received from Fisher Scientific without further purification.

Bi nanocrystal synthesis. Bi nanocrystals were prepared using the methods described in Example 1, above. TEM images and XRD data were taken of the Bi nanocrystals used to synthesize the nanowires. The average nanocrystal diameter is ~20 nm. The size distribution is relatively broad, however, there are very few particles much larger than 20 nm in diameter. The particles are spherical and crystalline and composed of Bi metal. The XRD pattern corresponds to rhombohedral Bi (JCPDS Card 44-1246). The peak broadening in the XRD data is consistent with nanocrystals with an average diameter of 20 nm based on the Scherrer equation.

Nanowire Synthetic Procedure. Reagent solutions (detailed below) were mixed in a nitrogen filled glove box and injected into a hot (~320-340° C.) coordinating solvent under nitrogen on a Schlenk line. Injection of the precursor solution decreased the solvent temperature by ~40° C. Once the temperature increased back to the initial injection temperature, nanowire growth was allowed to proceed for 5 minutes before taking the reaction flask off the heating mantle and allowing it to cool to room temperature.

InAs Nanowires in TOP/TOPO. A mixture of 61.4 mg $InCl_3$, 14.6 µL, $(SiMe_3)_3As$, 5.8 mg Bi nanocrystals, 300 µL toluene, 24 µL oleic acid, and 850 µL TOP was injected into 1 g of hot (330° C.) TOPO. The reaction yield was ~10%.

InAs Nanowires in TOA. A mixture of 18 mg $InCl_3$, 8.6 µL $(SiMe)_3As$, 1.7 mg Bi nanocrystals, 300 µL toluene, 24 µL oleic acid, and 850 µL TOA was injected into a hot (340° C.) solution of 5.6 mg myristic acid in 2.5 mL TOA. The yield was ~17%.

GaP Nanowires. A mixture of 60.4 µL, $(SiMe_3)_3P$, 1.7 mg Bi nanocrystals, 300 µL toluene, 24 µL oleic acid, and 850 µL, TOP was injected into a hot (320° C.) solution of 76 mg $Ga(acac)_3$ in 1 g TOPO. The yield was ~20%.

GaAs Nanowires. A mixture of 8.6 µL $(SiMe_3)_3As$, 1.7 mg Bi nanocrystals, 300 µL toluene, 24 µL oleic acid, and 850 µL TOA was injected into a hot (340° C.) solution containing 14.3 mg $GaCl_3$, and 5.6 mg myristic acid dissolved in 2.5 mL TOA. The yield was ~40%.

InP Nanowires. A mixture of 18 mg $InCl_3$, 23.6 µL $(SiMe_3)_3P$, 1.7 mg Bi nanocrystals, 300 µL toluene, 24 µL oleic acid, and 850 µL TOP was injected into a hot (340° C.) solution of 2 g TOPO and 5.6 mg myristic acid. The yield was ~57%.

Nanowire Purification. After cooling to room temperature after the reaction, the crude nanowire dispersions were diluted with 10 mL toluene and centrifuged at 8,000 rpm for 10 min. The supernatant was discarded. The nanowires were redispersed in $CHCl_3$ and precipitated again with butanol or ethanol and recentrifuged to obtain a purified nanowire product in the precipitate. Nanowires were stored dry under nitrogen prior to characterization.

Materials Characterization. Purified nanowires were characterized by scanning electron microscopy (SEM), transmission electron microscopy (TEM), energy dispersive x-ray spectroscopy (EDS), and x-ray diffraction (XRD). SEM samples were prepared by drop casting chloroform-dispersed nanowires onto glassy carbon substrates. SEM was performed on a LEO 1530 field emission gun SEM, operating at 3 kV accelerating voltage, and digital SEM images were acquired using an Inlens detector and LEO 32 software system. For TEM, nanowires were drop cast from chloroform onto 200-mesh lacey carbon-coated Cu grids (Electron Microscopy Sciences). TEM and EDS were performed on a JEOL 2010F field emission gun electron microscope operating at 200 kV accelerating voltage. Energy dispersive X-ray spectra were obtained with an attached Oxford INCA spectrometer. Digital TEM images were acquired with a Gatan multipole scanning CCD camera. XRD data was acquired from ~0.5 mg of nanowires on quartz slides using a Bruker-Nonius D8 Advance θ-2θ powder diffractometer with Cu $K_α$ radiation (λ=1.5418 Å) and collecting with a scintillation detector for 6-12 hours with an incremental angle of 0.02° at a scan rate of 12°/min.

InAs and GaP Nanowires. SEM and TEM images were taken of InAs and GaP nanowires synthesized in TOP/TOPO with Bi nanocrystals. InAs nanowires were formed through the dehalosilylation reaction between $InCl_3$ and $(SiMe_3)_3As$, and GaP nanowires were synthesized by reacting $Ga(acac)_3$ with $(SiMe_3)_3P$. Nanowires did not form without Bi nanocrystals. Both InAs and GaP nanowires were obtained with relatively high yield and nanowires ranged between 1 µm and 10 µm long. The best nanowire reaction yields were observed with the addition of oleic acid and myristic acid. TOP is generally regarded as a relatively weak-binding capping ligand and the carboxylated ligands most likely provide additional Bi particle steric stabilization under the nanowire growth conditions.

Figure 4:
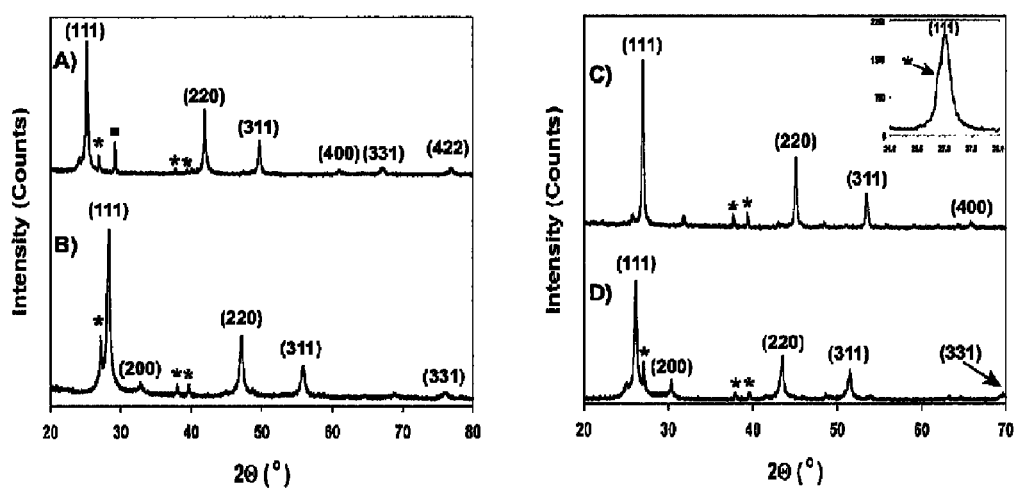
FIG. 4 shows XRD from (A) InAs, (B) GaP, (C) GaAs, and (D) InP nanowires. Bi peaks are labeled with a (*). The peak labeled in (A) with (■) is coesite (monoclinic $SiO_2$), the XRD substrate. InAs and GaAs nanowires were produced in trioctylamine (TOA). InP and GaP nanowires were produced in TOP/TOPO.

XRD shows that the nanowires are crystalline and exhibit cubic (sphalerite) crystal structure (FIG. 4). Both InAs and GaP grow predominantly in the <111> direction. The lattice spacings in of <111>-oriented InAs and GaP nanowires match the (111) d-spacings of InAs (3.498 Å) and GaP (3.14 Å) and the angles between the [$\bar{1}$ 1 $\bar{1}$] and [200] directions in the InAs and GaP nanowires are 55° and 56.3° respectively, which are characteristic of sphalerite (cubic) InAs and GaP.

InP Nanowires. InP nanowires were synthesized in TOP/TOPO in the presence of Bi nanocrystals by the dehalosilylation reaction between $InCl_3$ and $(SiMe_3)_3P$. The nanowire yield was again relatively high and XRD shows that the InP nanowires are crystalline with sphalerite (cubic) structure (FIG. 4). SEM and TEM images were taken of an InP nanowire sample. The InP nanowires are crystalline with the <111> growth direction. However, the InP nanowires are generally not as straight as the InAs and GaP nanowires, and TEM images of the nanowire bends reveal stacking faults as the possible source of bending. In comparison, SFLS-grown GaAs and GaP nanowires exhibit planar (111) twinning faults cross-sectioning the nanowires, unlike these stacking faults that appear at random orientations with respect to the growth direction (Davidson, F. M., III; Schricker, A. D.; Wiacek, R. J.; Korgel, B. A. *Adv. Mater.* 2004, 16, 646-649; Davidson, F. M., III; Wiacek, R.; Korgel, B. A. *Chem. Mater.* 2005, 17, 230-233). Although a very careful crystallographic analysis of the faults has not been carried out, they are most likely (111) stacking faults since the (111) planes are the slip planes in a sphalerite crystal (Takeuchi, S.; Suzuki, K. *Phys. Stat. Sol. a* 1999, 171, 99-103). Under poor growth conditions—such as starved In and P supply—stacking faults can be introduced into the nanowires to give rise to a tortuous morphology, as has been observed in Si nanowires (Lu, X.; Hanrath, T.; Johnston, K. P.; Korgel, B. A. *Nano Lett.* 2003, 3, 93-99).

GaAs Nanowires. SEM images were taken of GaAs nanowires produced in TOP/TOPO from $GaCl_3$ and $(SiMe_3)_3$As. GaAs nanowires were also produced using alternative Ga precursors, including $(tBu)_3Ga$ and $Ga(acac)_3$.

Trioctylamine, in place of TOP/TOPO as the solvent, was found to produce high quality GaAs nanowires in high yield from the dehalosilylation reaction with $GaCl_3$ and $(SiMe_3)_3$As. The phosphorus-containing TOP/TOPO mixture quenches GaAs nanowire formation. TOP/TOPO forms a relatively strong complex with Ga and complex formation competes with the dehalosilylation reaction. The GaAs nanowires produced in TOA from GaCl$_3$ and (SiMe$_3$)$_3$As were crystalline with sphalerite crystal structure, as shown by the XRD pattern in FIG. 4. The GaAs nanowires grow in the <111> direction.

InAs nanowires could also be produced in TOA, rather than TOP/TOPO, although TOP does not quench the InAs formation reaction nearly as much as the GaAs reaction. TOP influences the reaction significantly, but the In-TOP complex is not as chemically stable as the Ga-TOP complex and InAs nanowires form to a significant extent.

Figure 5:
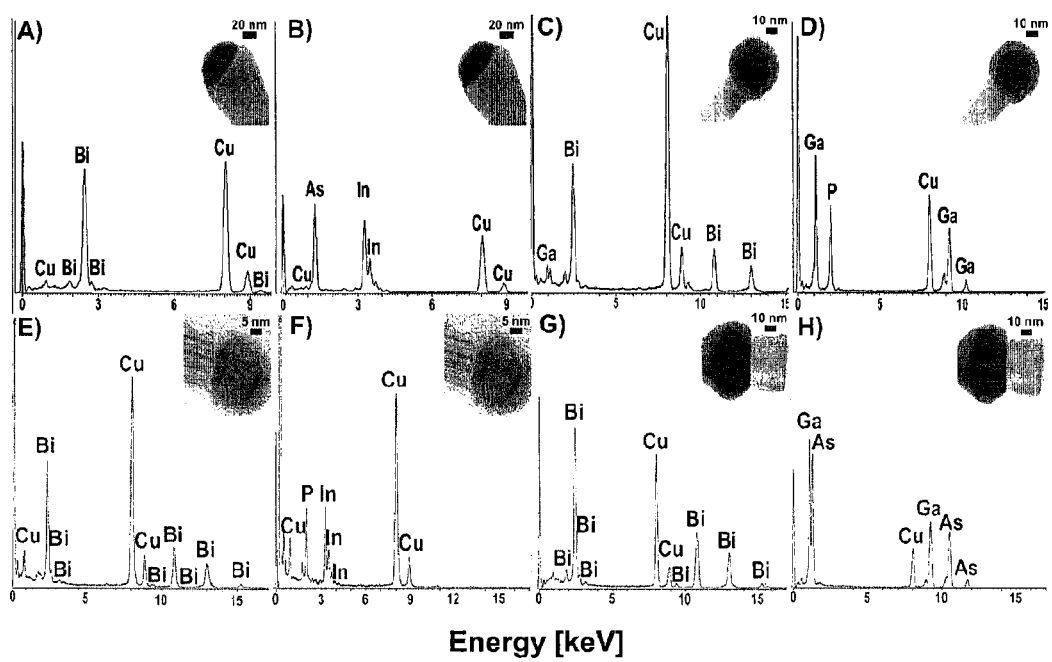
FIG. 5 shows EDS data obtained from nanocrystals at the tip of (A) InAs, (C) GaP, (E) InP, and (G) GaAs nanowires compared to EDS from the (B) InAs, (D) GaP, (F) InP, and (H) GaAs nanowires. InAs, InP, and GaP nanowires were produced in TOP/TOPO. GaAs nanowires were produced in TOA.

Bi nanocrystals at the tips of the wires. The XRD data in FIG. 4 for the GaP, GaAs, InP and InAs nanowires confirmed their sphalerite structure (InAs (JCPDS Card 15-0869), GaP (JCPDS Card 12-0191), GaAs (JCPDS Card 32-0389) and InP (JCPDS Card 32-0452)). In all of the nanowire XRD data, diffraction peaks also appear from Bi metal. The diffraction peaks are slightly narrower than those obtained from XRD of the starting Bi nanocrystals, indicating that Bi particle aggregation during the nanowire synthesis may occur to some extent. However, the peaks are still relatively broad, consistent with an average domain size in the 20~40 nm range. This size range is consistent with TEM images that reveal 20~40 nm diameter Bi particles residing at the tips of the nanowires, as shown in FIG. 5. EDS line scans confirmed that the particles are Bi, and are free of Ga and In metal, and that the nanowires are free of Bi.

Example 3

Synthesis of Silicon Nanowires Using Bismuth Seed Nanocrystals

Chemicals. All manipulations were done using Schlenk line techniques under nitrogen. Trisilane (Si$_3$H$_8$) was used as received from Gelest. Bismuth (III) 2-ethylhexanoate, and tri-n-octylphosphine (97%, TOP), were used as received from STREM. Ethylenediamine, dioctylether, sodium borohydride (NaBH$_4$), trioctylamine (TOA), and squalane were used as received from Sigma-Aldrich. All other solvents were used as received from Fisher Scientific without further purification.

Bi nanocrystal synthesis. Bi nanocrystals were prepared following the procedure detailed in Example 1.

Si nanowire synthesis. 3 ml squalane, which served as the nanowire growth solution, was added to a 4-neck reaction flask that was attached to a Schlenk line. The squalane was dried and degassed by heating the reaction flask to 100° C. under vacuum and then maintaining this temperature, while under vacuum, for 60 min. Separately, a reagent solution containing 1 ml TOA, 1.5 mg Bi nanocrystals, and 6 µl Si$_3$H$_8$ was prepared inside of a nitrogen filled glove box. Once the squalane was dried and degassed, the reaction flask was backfilled with nitrogen, and the temperature was increased to 416° C. The reagent solution was then rapidly injected into the hot (416° C.) squalane whereupon the temperature decreased by ~40° C. Once the temperature returned to 416° C., nanowire growth was allowed to proceed for 5 min. before removing the heating mantle and allowing the reaction flask to cool to room temperature.

Nanowire Purification. Once the reaction flask was cooled to room temperature, the crude nanowire dispersion was diluted with the addition of 10 ml of toluene. The nanowire product was purified by first centrifuging the crude nanowire dispersion, without adding any antisolvent, at 8,000 rpm for 10 min. The supernatant was discarded and the precipitate was redispersed in chloroform and precipitated once again by adding ethanol and recentrifuging.

Materials Characterization. Purified nanowires were characterized by transmission electron microscopy (TEM), and energy dispersive x-ray spectroscopy (EDS). For TEM, nanowires were drop cast from chloroform onto 200-mesh lacey carbon-coated Cu grids (Electron Microscopy Sciences). TEM and EDS were performed on a JEOL 2010F field emission gun electron microscope operating at 200 kV accelerating voltage. Energy dispersive X-ray spectra were obtained with an attached Oxford INCA spectrometer. Digital TEM images were acquired with a Gatan multipole scanning CCD camera.

Example 4

Synthesis of Se doped CdTe Nanowires Using Bismuth Seed Nanocrystals

Chemicals. All manipulations were done using Schlenk line techniques under nitrogen. Trioctylphosphine oxide (99%, TOPO), tri-n-octylphosphine (97%, TOP), bismuth (III) 2-ethylhexanoate, and selenium powder were used as received from STREM. n-Octadecylphosphonic acid (ODPA) was used as received from Alfa Aesar. Cadmium oxide (CdO), ethylenediamine, dioctylether, tellurium powder, and sodium borohydride (NaBH$_4$) were used as received from Sigma-Aldrich. Solutions of tri-n-octylphosphine selenide (0.238M, TOP—Se), and tri-n-octylphosphine telluride (0.237M, TOP—Te) were prepared by dissolving 0.094 g elemental Se and 0.151 g elemental Te respectively in 5 ml TOP. All other solvents were used as received from Fisher Scientific without further purification. Bi nanocrystal synthesis. Bi nanocrystals were prepared following the procedure detailed in Example 1.

Se doped CdTe nanowire synthesis. A mixture consisting of 3 g TOPO, 0.018 g CdO, and 0.048 g ODPA was added to a 4-neck reaction flask that was attached to a Schlenk line. The TOPO/CdO/ODPA mixture was dried and degassed by heating the reaction flask to 100° C. under vacuum and then maintaining this temperature, while under vacuum, for 30 min. Separately, two reagent solutions were prepared inside of a nitrogen filled glove box. The first reagent solution consisted of 1.5 mg Bi nanocrystals, 121 µl TOP—Te, and 500 µl TOP. The second reagent solution consisted of 121 µl TOP—Se and 500 µl TOP. Once the TOPO/CdO/ODPA mixture was dried and degassed, the reaction flask was backfilled with nitrogen, and the temperature was increased to 340° C. The TOPO/CdO/ODPA mixture was stirred at 340° C. for 60 min. to enable the CdO to react with the ODPA. The formation of the Cd—ODPA complex is evidenced by the appearance of the TOPO/CdO/ODPA mixture which progressively changes from milky to clear. Once the hot (340° C.) TOPO/CdO/ODPA mixture became clear, the first reagent solution was rapidly injected into the reaction flask, whereupon the temperature decreased to 330° C. The second reagent solution was then rapidly injected into the reaction flask at 330° C., whereupon the temperature decreased to 320° C. After the addition of the second reagent solution, nanowire growth was allowed to proceed for 60 sec. before removing the heating mantle and allowing the reaction flask to cool to room temperature.

Nanowire Purification. Once the reaction flask was cooled to room temperature, the crude nanowire dispersion was diluted with the addition of 10 ml of toluene. The nanowire product was purified by first centrifuging the crude nanowire dispersion, without adding any antisolvent, at 6,000 rpm for 5 min. The precipitate was discarded and the supernatant was precipitated by adding ~20 ml methanol and centrifuging at 6,000 rpm for 8 min. The precipitate collected was the nanowire product.

Materials Characterization. Purified nanowires were characterized by transmission electron microscopy (TEM), energy dispersive x-ray spectroscopy (EDS), and x-ray diffraction (XRD). For TEM, nanowires were drop cast from chloroform onto 200-mesh lacey carbon-coated Cu grids (Electron Microscopy Sciences). TEM and EDS were performed on a JEOL 2010F field emission gun electron microscope operating at 200 kV accelerating voltage. Energy dispersive X-ray spectra were obtained with an attached Oxford INCA spectrometer. Digital TEM images were acquired with a Gatan multipole scanning CCD camera. XRD data was acquired from ~0.5 mg of nanowires on quartz slides using a Bruker-Nonius D8 Advance θ-2θ powder diffractometer with Cu Kα radiation ($\lambda$=1.5418 Å) and collecting with a scintillation detector for 6-12 hours with an incremental angle of 0.02° at a scan rate of 12°/min.

Example 5

Synthesis of ZnS, ZnSe, and ZnTe Nanowires Using Bismuth Seed Nanocrystals

Chemicals. All manipulations were done using Schlenk line techniques under nitrogen. Trioctylphosphine oxide (99%, TOPO), tri-n-octylphosphine (97%, TOP), bismuth (III) 2-ethylhexanoate, and selenium powder were used as received from STREM. Zinc oxide (ZnO), diethylzinc solution (~1M in hexane, $Et_2Zn$), oleic acid (60%, OA), oleylamine (70%), squalane, ethylenediamine, dioctylether, tellurium powder, sulfur powder, and sodium borohydride ($NaBH_4$) were used as received from Sigma-Aldrich. Solutions of tri-n-octylphosphine sulfide (1M, TOP—S), tri-n-octylphosphine selenide (1M, TOP—Se), and tri-n-octylphosphine telluride (0.237M, TOP—Te) were prepared by dissolving 0.16 g elemental S, 0.395 g elemental Se, and 0.151 g elemental Te respectively in 5 ml TOP. All other solvents were used as received from Fisher Scientific without further purification.

Bi nanocrystal synthesis. Bi nanocrystals were prepared following the procedure detailed in Example 1.

Degassing Procedure. After nanowire growth solutions (detailed below) were added to a reaction flask, they were dried and degassed by heating the reaction flask to 100° C. under vacuum and then maintaining this temperature, while under vacuum, for the times specified below.

Nanowire Synthesis Procedure. Reagent solutions (detailed below) were mixed in a nitrogen filled glove box and injected into a hot nanowire growth solution (temperature indicated below) under nitrogen on a Schlenk line. Injection of the reagent solution decreases the nanowire growth solution temperature by ~10° C. Once the temperature increased back to the initial injection temperature, nanowire growth was allowed to proceed for the time indicated below before taking the reaction flask off the heating mantle and allowing it to cool to room temperature.

ZnS nanowire synthesis. A 4 neck reaction flask was attached to a Schlenk line and charged with 3 ml squalane, which served as the nanowire growth solution. The squalane was degassed for 60 min. The reaction flask was then backfilled with nitrogen and the temperature was increased to 350° C. A reagent solution consisting of 1.5 mg Bi nanocrystals, 144 µl $Et_2Zn$, 144 µTOP—S, and 216 µl toluene was then rapidly injected into the hot (350° C.) squalane. Nanowire growth was allowed to proceed for 5 min.

ZnSe nanowire synthesis. A 4 neck reaction flask was attached to a Schlenk line and charged with 3 g TOPO, which served as the nanowire growth solution, and 11.7 mg ZnO. The TOPO/ZnO mixture was dried and degassed for at least 60 min. The reaction flask was then backfilled with nitrogen, and 200 µOA, which served as the Zn coordinating agent, was added to the dried and degassed TOPO/ZnO mixture. The TOPO/ZnO/OA mixture was then degassed for an additional 30 min. after which it was backfilled with nitrogen and heated to 350° C. The TOPO/ZnO/OA mixture was stirred at 350° C. for 20 min. to enable the ZnO to react with the OA. The formation of the Zn—OA complex is evidenced by the appearance of the TOPO/ZnO/OA mixture which progressively changes from milky to clear. Once the hot (350° C.) TOPO/ZnO/OA mixture became clear, a reagent solution consisting of 1.5 mg of Bi nanocrystals, 144 µl TOP—Se, and 360 µl toluene was rapidly injected into the reaction flask. Nanowire growth was allowed to proceed for 5 min.

ZnTe nanowire synthesis. A 4 neck reaction flask was attached to a Schlenk line and charged with 3 ml oleylamine, which served as the nanowire growth solution. The oleylamine was degassed for 60 min. The reaction flask was then backfilled with nitrogen and the temperature was increased to 345° C. A reagent solution consisting of 1.5 mg Bi nanocrystals, 144 µl $Et_2Zn$, 144 µl TOP—S, and 610 µl TOP—Te was then rapidly injected into the hot (345° C.) oleylamine. Nanowire growth was allowed to proceed for 60 sec.

Nanowire Purification. Once the reaction flask was cooled to room temperature, the crude nanowire dispersion was diluted with the addition of 10 ml of toluene. The nanowire product was purified by first centrifuging the crude nanowire dispersion, without adding any antisolvent, at 8,000 rpm for 10 min. The supernatant was discarded and the precipitate was redispersed in chloroform and precipitated once again by adding ethanol and recentrifuging.

Materials Characterization. Purified nanowires were characterized by scanning electron microscopy (SEM), transmission electron microscopy (TEM), energy dispersive x-ray spectroscopy (EDS), and x-ray diffraction (XRD). SEM samples were prepared by drop casting chloroform-dispersed nanowires onto glassy carbon substrates. SEM was performed on a LEO 1530 field emission gun SEM, operating at 3 kV accelerating voltage, and digital SEM images were acquired using an Inlens detector and LEO 32 software system. For TEM, nanowires were drop cast from chloroform onto 200-mesh lacey carbon-coated Cu grids (Electron Microscopy Sciences). TEM and EDS were performed on a JEOL 2010F field emission gun electron microscope operating at 200 kV accelerating voltage. Energy dispersive X-ray spectra were obtained with an attached Oxford INCA spectrometer. Digital TEM images were acquired with a Gatan multipole scanning CCD camera. XRD data was acquired from ~0.5 mg of nanowires on quartz slides using a Bruker-Nonius D8 Advance θ-2θ powder diffractometer with Cu Kα radiation ($\lambda$=1.5418 Å) and collecting with a scintillation detector for 6-12 hours with an incremental angle of 0.02° at a scan rate of 12°/min.

For the purposes of this disclosure and unless otherwise specified, "a" or "an" means "one or more". All patents, applications, references and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

While the principles of this invention have been described in connection with specific embodiments, it should be understood clearly that these descriptions are made only by way of example and are not intended to limit the scope of the invention.

What is claimed is:

1. A method for producing nanowires, comprising:
exposing at least one nanowire precursor to metal nanoparticles in a nanowire growth solution comprising an organic solvent in a non-supercritical state, whereby the metal nanoparticles act as seed particles for the growth of the nanowires, wherein the nanowires comprise a material selected from the group consisting of (a) Group IV elements, (b) Group II elements other than cadmium, (c) Group VI elements other than tellurium, (d) combinations of a Group III element and a Group V element which include at least one element selected from the group consisting of aluminum and, nitrogen, and (e) GaP.

2. The method of claim 1, wherein the nanowires are grown at a temperature of no more than about 450° C.

3. The method of claim 1, wherein the metal nanoparticles are formed in situ from metal nanoparticle precursors in the nanowire growth solution.

4. The method of claim 3, wherein the metal nanoparticle precursors comprise organometallic molecules comprising at least one of Bi, In, Al, Pb or Sn.

5. The method of claim 1, wherein the Group IV nanowires are silicon nanowires.

6. The method of claim 1, wherein the Group IV nanowires are germanium nanowires.

7. The method of claim 1, wherein the nanowires are GaP nanowires.

8. The method of claim 1, wherein the nanowires are selected from the group consisting of GaN nanowires and InN nanowires.

9. The method of claim 1, wherein the nanowires are selected from the group consisting of GaSb nanowires, InSb nanowires, AlAs nanowires, AlP nanowires and AlSb nanowires.

10. The method of claim 1, wherein the nanowires comprise alloys of two or more Group IV elements.

11. The method of claim 1, wherein the nanowires comprise core/shell nanowires.

12. The method of claim 1, wherein the nanowires are doped with impurities.

13. The method of claim 1, wherein the metal nanoparticles are bismuth nanoparticles.

14. The method of claim 1, wherein the metal nanoparticles are suspended in the nanowires growth solution during the growth of the nanowires.

15. The method of claim 1, wherein the nanowires are grown at ambient pressure.

16. The method of claim 1, wherein the nanowire precursor is trisilane.

17. The method of claim 1, wherein the nanowires comprise a material selected from the group consisting of Si and Ge, and wherein the metal nanoparticles comprise a material selected from the group consisting of bismuth and indium.

18. A method for producing nanowires, comprising:
exposing at least one nanowire precursor to metal nanoparticles in a nanowire growth solution comprising an organic solvent in a non-supercritical state, whereby the metal nanoparticles act as seed particles for the growth of the nanowires, wherein the metal nanoparticles comprise a metal selected from the group consisting of bismuth, tin, aluminum and lead and further wherein the nanowires comprise (a) an element selected from the group consisting of Group IV elements, (b) a combination of a first element selected from the group consisting of Group III elements and a second element selected from the group consisting of Group V elements, and (c) a combination of a first element selected from the group consisting of Group II elements other than cadmium, and a second element selected from the group consisting of Group IV elements other than tellurium.

19. The method of claim 18, wherein the metal nanoparticles comprise tin, aluminum or lead.

20. The method of claim 18, wherein the metal nanoparticles comprises bismuth.

21. The method of claim 20, wherein the nanowires are Si nanowires.

22. The method of claim 20, wherein the nanowires are Ge nanowires.

23. The method of claim 20, wherein the nanowires are Group III-V nanowires.

24. The method of claim 23, wherein the nanowires are selected from the group consisting of GaP nanowires, GaAs nanowires, InP nanowires, and InAs nanowires.

25. The method of claim 20, wherein the nanowires are selected from the group consisting of ZnS nanowires, and ZnSe nanowires.

26. The method of claim 18, wherein the metal nanoparticles are suspended in the nanowires growth solution during the growth of the nanowires.

27. The method of claim 18, wherein the nanowires are grown at ambient pressure.

28. The method of claim 18, wherein the nanowire precursor is trisilane.

29. The method of claim 18, wherein the nanowires comprise a material selected from the group consisting of Si and Ge, and wherein the metal nanoparticles comprise a material selected from the group consisting of bismuth and indium.

30. A method for producing nanowires, comprising:
exposing at least one nanowire precursor to metal nanoparticles in a nanowire growth solution comprising an organic solvent in a non-supercritical state, whereby the metal nanoparticles act as seed particles for the growth of the nanowires, wherein the nanowires comprise a material selected from the group consisting of (a) Group IV elements, (b) Group II elements other than cadmium, (c) Group VI elements other than tellurium, (d) combinations of a Group III element and a Group V element including at least one of aluminum and nitrogen, and (e) GaP.

31. The method of claim 30, wherein the nanowires are grown at a temperature of no more than about 450° C.

32. The method of claim 30, wherein the semiconductor nanowires are synthesized by a solution-liquid-solid growth process.

33. The method of claim 30, wherein the organic solvent has a boiling point of at least about 200° C.

34. The method of claim 30, wherein the organic solvent is a phosphorus- or nitrogen-containing polar organic solvent.

35. The method of claim 34, wherein the organic solvent is selected from the group consisting of trioctylphosphine, trioctylphosphine oxide, triphenylphosphine, and triphenylphosphine oxide.

36. The method of claim 34, wherein the organic solvent is an amine.

37. The method of claim 36, wherein the organic solvent is selected from the group consisting of trioctylamine and oleylamine.

38. The method of claim 34, wherein the organic solvent is a fluorinated solvent.

39. The method of claim 34, wherein the organic solvent is an ionic liquid.

40. The method of claim 30, wherein the metal nanoparticles are suspended in the nanowires growth solution during the growth of the nanowires.

41. The method of claim 30, wherein the nanowires are grown at ambient pressure.

42. The method of claim 30, wherein the nanowire precursor is trisilane.

43. The method of claim 30, wherein the nanowires comprise a material selected from the group consisting of Si and Ge, and wherein the metal nanoparticles comprise a material selected from the group consisting of bismuth and indium.

* * * * *